US007574640B2

(12) United States Patent
Mitra et al.

(10) Patent No.: US 7,574,640 B2
(45) Date of Patent: Aug. 11, 2009

(54) COMPACTING CIRCUIT RESPONSES

(75) Inventors: Subhasish Mitra, Rancho Cordova, CA (US); Kee Sup Kim, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 968 days.

(21) Appl. No.: 10/656,013

(22) Filed: Sep. 5, 2003

(65) Prior Publication Data

US 2005/0055613 A1    Mar. 10, 2005

(51) Int. Cl.
*G01R 31/28* (2006.01)
(52) U.S. Cl. ...................................... 714/726
(58) Field of Classification Search .......... 714/726–729, 714/733–734, 736, 738–739, 30, 819, 724, 714/742; 716/2, 4
See application file for complete search history.

(56) References Cited

U.S. PATENT DOCUMENTS

| | | | | | |
|---|---|---|---|---|---|
| 4,503,537 | A | * | 3/1985 | McAnney | 714/728 |
| 4,628,509 | A | * | 12/1986 | Kawaguchi | 714/711 |
| 5,436,912 | A | * | 7/1995 | Lustig | 714/719 |
| 5,831,992 | A | * | 11/1998 | Wu | 714/732 |
| 6,259,637 | B1 | * | 7/2001 | Wood et al. | 365/200 |
| 6,373,758 | B1 | * | 4/2002 | Hughes et al. | 365/200 |
| 6,401,226 | B1 | * | 6/2002 | Maeno | 714/728 |
| 6,557,129 | B1 | * | 4/2003 | Rajski et al. | 714/729 |
| 6,574,762 | B1 | * | 6/2003 | Karimi et al. | 714/727 |
| 6,636,998 | B1 | * | 10/2003 | Lee et al. | 714/735 |
| 6,829,740 | B2 | * | 12/2004 | Rajski et al. | 714/729 |
| 7,032,148 | B2 | * | 4/2006 | Wang et al. | 714/729 |
| 7,185,253 | B2 | * | 2/2007 | Mitra et al. | 714/734 |
| 2003/0115521 | A1 | * | 6/2003 | Rajski et al. | 714/724 |
| 2003/0154433 | A1 | * | 8/2003 | Wang et al. | 714/726 |
| 2003/0188269 | A1 | | 10/2003 | Mitra et al. | 716/2 |
| 2005/0097419 | A1 | * | 5/2005 | Rajski et al. | 714/742 |
| 2006/0036985 | A1 | * | 2/2006 | Mitra et al. | 716/8 |
| 2006/0041814 | A1 | * | 2/2006 | Rajski et al. | 714/742 |

OTHER PUBLICATIONS

Mitra et al "An Efficient Response Compaction Technique For Test Cost Reduction" IEEE, Apr. 2002, pager 11.2, pp. 311-320.*
Patel et al "Application of Saluja-Karpovsky Compactors to Test Responses with Many Unknowns". Jul. 16, 2003, Proceedings of the $21^{st}$ IEEE VLSI Test Symposium (VTS'03) total 6pages.*
Rajski et al "Convolutional Compaction of Test Responses" ITC International Test Conference, IEEE copyright Aug. 6, 2003, paper 29.3, pp. 745-754.*

* cited by examiner

*Primary Examiner*—Phung M Chung
(74) *Attorney, Agent, or Firm*—Trop, Pruner & Hu, P.C.

(57) ABSTRACT

A compactor has a reduced number of outputs and the ability to handle a higher number of errors and unknown logic values. The procedure for designing the matrix and the resulting compactor involves determining the number of unknown logic values that may be encountered and adding columns to the compactor matrix based on the number of errors. Basically, the number of possible combinations of scan in lines is determined. Then, additional columns are added for each possible combination of scan in lines. The number of columns that are added for each combination of scan in lines is equal to the number of errors plus one in one embodiment.

15 Claims, 2 Drawing Sheets

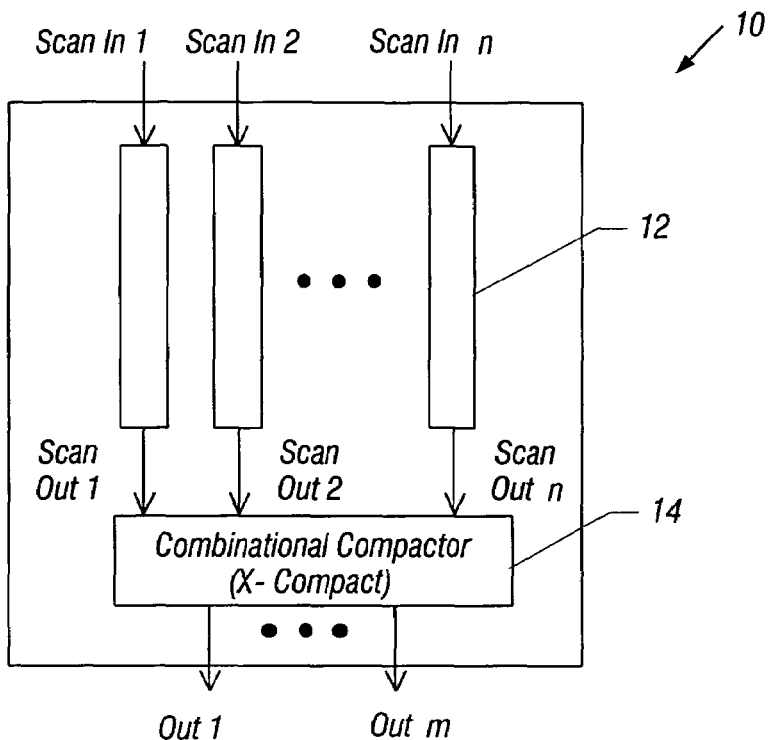
FIG. 1
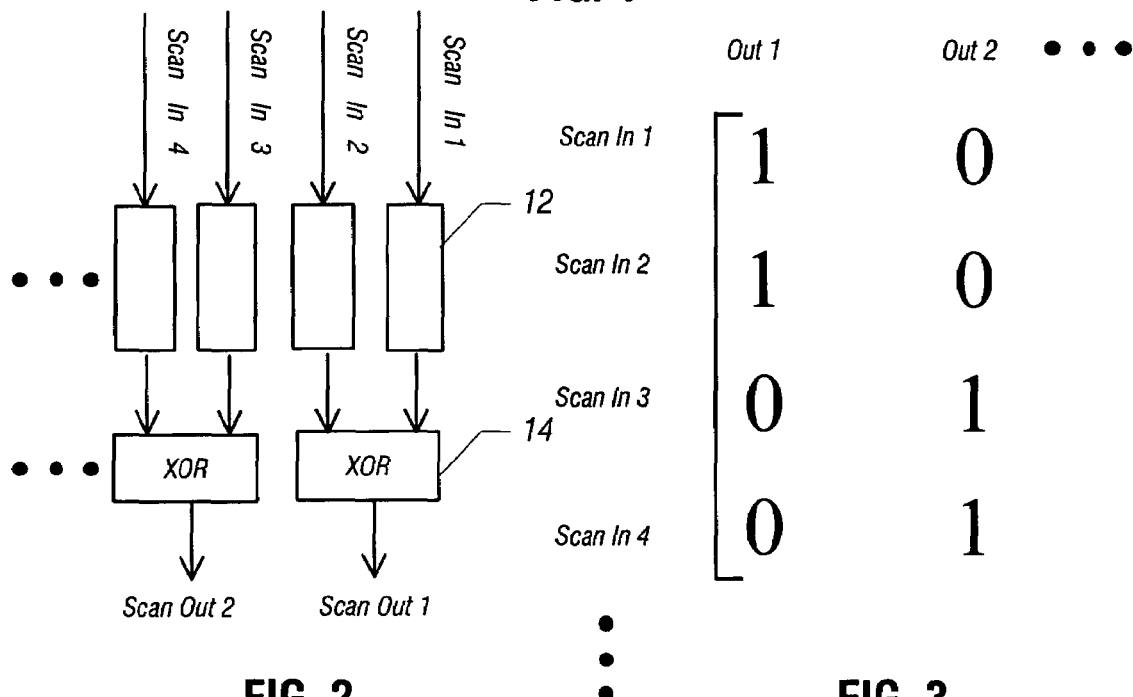
FIG. 2
FIG. 3

COMPACTING CIRCUIT RESPONSES

BACKGROUND

This invention relates generally to integrated circuits.

Integrated circuits include input pins for receiving signals from the outside world and output pins for providing signals to the outside world. Since integrated circuit packages are advantageously compact, increasing the number of pins means increasing the integrated circuit packaging size and cost.

For example, when testing integrated circuits, a number of modules or components may be scanned or analyzed for errors or defects. The more scan chains of modules to be analyzed, generally the more pins that are needed to receive signals from those scan chains. Conversely, the longer the scan chains, the slower the testing process. Either way, the costs may be aggravated.

Some of the major contributors to integrated circuit test cost include: available tester memory, available number of tester channels, test time, and number of pins available for scan-in and scan-out purposes. All these contributors to test cost have direct relationships with the scan chain lengths and the number of scan chains.

Therefore, there is a need for better ways to compact circuit outputs to reduce the number of circuit pins or connectors without increasing the size of the circuit elements.

BRIEF DESCRIPTION OF THE DRAWINGS

FIG. 1 is a schematic depiction of one embodiment of the present invention;

FIG. 2 is a partial depiction of one embodiment in accordance with FIG. 1;

FIG. 3 is a partial depiction of a matrix in accordance with the embodiment shown in FIG. 2.

DETAILED DESCRIPTION

Figure 4:
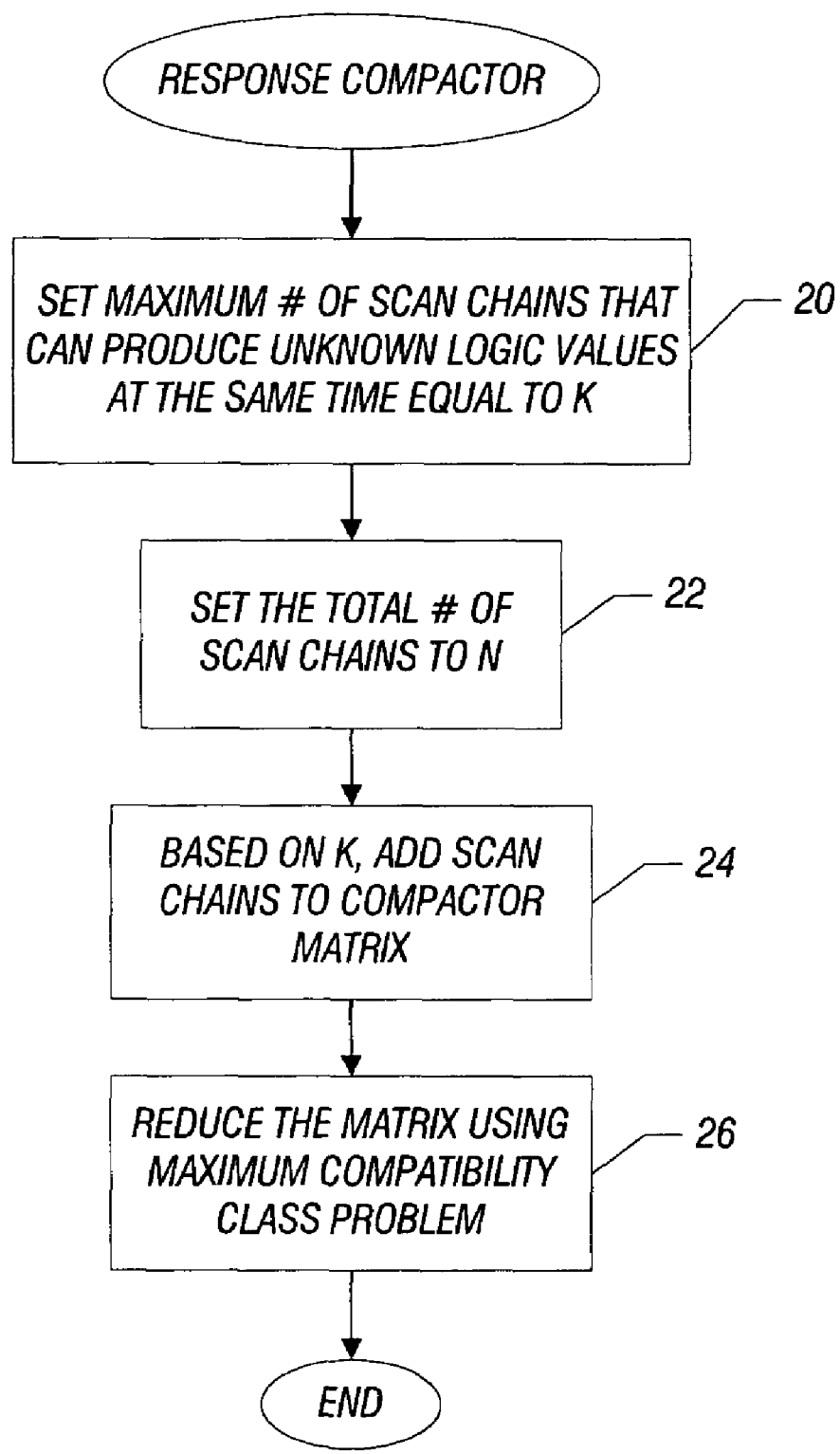
FIG. 4 is a flow chart for one embodiment of the present invention.

Referring to FIG. 1, a response compactor 10 may include scan in chains 12, identified as chains 1 through n. The circuit elements comprising the scan in chains can be any of a variety of circuit elements, components, or modules. The circuit outputs or scan outs 1 through n, from the scan in chains 12, may be compacted by a combinational compactor 14 to produce outputs 1 through m, where m is significantly less than n. In this way, the number of circuit outputs may be reduced to a manageable level. For example, the compaction of the number of circuit outputs may reduce the number of output pins, reducing the cost of the resulting hardware in one embodiment.

In some embodiments of the present invention, a large number of test errors in scan chains may be handled. Also, a large number of unknown logic values can be accommodated. Thus, a relatively cost effective design that can handle a large number of scan errors and unknown logic values may be achieved in some embodiments.

In the ensuing discussion, examples are provided in connection with circuits for testing integrated circuits. In such cases, a scan chain may be analyzed by providing a stimulus to the scan chain and receiving its output. In many complex integrated circuits, a large number of scan chains may each be provided with a stimulus. The responses of those scan chains may be collected. In accordance with some embodiments of the present invention, the number of outputs that are provided to pins or other connectors may be reduced using a response compactor 10. However, the present invention is not limited to testing embodiments and is applicable to a wide variety of integrated circuits.

Some of the scan chains can produce logic values unknown during simulation (often called X-values) at the same scan-out cycle when some other scan chain produces an error. In that case, there is a chance that this error can get masked and the defect is not detected.

Referring to FIG. 2, in accordance with one embodiment of the present invention, the scan ins 1 through n are indicated at 12 and they may be coupled to a response compactor made up of exclusive OR (XOR) gates 14 in one embodiment. While an embodiment using a combinational compactor is shown, embodiments using sequential compactors may also be used by the duality between space versus time compression. Also, flip-flops or other devices may be used instead of XOR gates 14.

The matrix representing the embodiment shown in FIG. 2 is illustrated in FIG. 3. Thus, the output 1 is created from an exclusive OR gate 14 from scan ins 1 and 2, because a one is indicated in each row under output 1 for scan ins 1 and 2. Similarly, scan ins 3 and 4 are provided at output 2 through another exclusive OR gate 14 because of the ones indicated in the second column of the matrix shown in FIG. 3.

In order to develop the compactor 10, the designer determines the maximum number of scan chains that can produce unknown logic values at the same time. This number may be assigned the value K. Also, the designer determines the total number of scan chains and assigns the value N to that number. If there are K unknown logic values, N−K error-free outputs each have at least one path to a compactor output without being affected by any one of the K unknown logic values.

For every combination of K scan chains, K+1 columns are added to the compactor matrix in one embodiment. Thus, in an example with 100 scan chains, where K=2, 100×99×98 divided by 6 (3×2×1) or almost 160,000 combinations are possible. In an example where K equals 2, K+1=3, so there are almost 480,000 columns that result from taking every combination of scan ins in groups of 3. Thus, for example, every combination of the scan ins may be taken.

This addition of columns results in a matrix with a large number of columns. Each column in the matrix ultimately may correspond to structure in the resulting compactor design in a fashion described hereafter.

In order to create the matrix, a row that corresponds to a chosen scan chain has the values 100 . . . entered into its matrix as new columns. The new columns have the values one then zero, then another zero extending to K+1 new columns. Thus, in the example where K equals 2, 3 columns are added with values 100 in the first row. The next scan chain in the combination is then assigned the values 010 . . . . The row corresponds to the chosen scan chain and the columns correspond to the newly added columns. In an example where K equals 2, the second scan chain in each particular combination is assigned the value 010 in the second row. Then the third scan chain in the combination is chosen and the values 001 . . . are entered into the matrix. Again, the row corresponds to the chosen scan chain and the columns correspond to the newly added columns. In a simple example where K equals 2, the numbers 001 are provided as new columns in the third scan chain row of the chosen set of 3. The entries in the remaining rows in the newly added columns may be provided with "don't care" values.

The number of columns can become exceptionally large. However, the number of columns may be reduced using maximum compatibility class problem analysis. This analysis says that any two columns can be merged and represented by a single column if the two columns do not have conflicting 1's and 0's in the same row. Thus, any 1's and 0's that are the same for all the scan lines for a given pair of columns can be reduced and represented by a single column. Don't care values are not material. Thus, a 0 in one column in the same row with a don't care in another column match and a 1 in the same row with a don't care also matches. There is only a conflict if a 1 is matched with a 0 on the same row or a 0 is matched with a 1 on the same row.

One of the merged columns can be eliminated, resulting in a minimum number of columns. It is a necessary and sufficient condition for multiple unknown handling matrixes to match element by element in two columns.

Once the matrix is developed and reduced, all that needs to be done then is to develop the compactor. In each case where a 1 is arranged for a given output in a given scan in, that scan in is connected through an exclusive OR gate 14 to the indicated output, in one embodiment. Thus, in the case of the matrix shown in FIG. 3, because there is a 1 across from scan in 1 and under output 1, an exclusive OR gate connects the scan in 1 to the output 1. Because there is a 1 under output 1 and across from scan in 2, the same exclusive OR gate couples scan in 2 to output 1. This arrangement is repeated to produce the desired number of rows and columns.

Referring to FIG. 4, in an embodiment implemented in software, initially the maximum number of scan chains that can produce unknown logic values at the same time is set equal to K, as indicated at block 20. The total number of scan chains is set equal to N, as indicated in block 22. Then, based on K, scan chains are added to the compactor matrix, as indicated in block 24. For example, K+1 columns may be added to the scan chain matrix for each possible combination of K+1 scan chains. For every combination of K+1 scan chains, columns may be added to the matrix. Then the number of columns in the matrix may be reduced using maximum compatibility class problem as indicated in block 26.

Thus, the aim is to guarantee the detection of P or fewer errors when K or fewer scan chains produce unknowns. To do so, a reduced matrix is obtained by removing any K rows of the original matrix and columns in which any of these K rows have ones. A bit-wise exclusive OR of any P or fewer rows of this matrix must not be all zeros.

In one embodiment, a response compactor may be formed with a plurality of exclusive OR gates arranged to handle any number of scan in errors and unknown logic values. A compactor may handle any number of errors in the same scan cycle. Moreover, in some embodiments, the compactor may have the minimum number of scan outputs. For example, using the maximum compatibility class problem, the number of columns may be reduced to the minimum possible number. This corresponds to having the minimum number of scan outputs.

In some embodiments, the compactor may be coupled to other devices, such as the so-called Intel scan out structure, that may use a shift register. Other devices, including counters, could also be used on the compactor output.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a compactor matrix for a response compactor circuit; and
   for each scan chain that produces an unknown logic value at the same time as another scan chain produces an unknown value, adding at least two columns to said matrix.

2. The method of claim 1 including obtaining the maximum number of scan chains that can produce unknown logic values at the same time.

3. The method of claim 1 including reducing the compactor matrix using maximum compatibility class problem.

4. The method of claim 3 including eliminating from the matrix one of at least two matching columns.

5. The method of claim 1 wherein adding at least two columns to the compactor matrix includes adding at least two columns to the compactor matrix for every combination of unknown logic values plus one.

6. The method of claim 5 including adding values to rows of said compactor matrix such that for a first row the first column has a value one and the succeeding columns have the value zero and a second row has the column value zero and the succeeding columns have the value one and a third row has a first column of column value zero, followed by a second column of value zero, followed by a third column of value one.

7. A response compactor formed by a process including the steps of:
   obtaining a number of circuit outputs from scan chains that can produce unknown logic values at the same time; and
   for each scan chain that produces an unknown logic value at the same time as another scan chain produces an unknown value, adding at least two columns to a compactor matrix.

8. The compactor of claim 7 formed by the process wherein obtaining the number of circuit outputs that produces unknown logic values at the same time includes determining a maximum number of circuit outputs that can produce errors at the same time.

9. The compactor of claim 7 formed by the process including reducing the compactor matrix using maximum compatibility class problem.

10. The compactor of claim 9 wherein said compactor is formed of the process including eliminating from the matrix one of at least two matching columns.

11. The compactor of claim 7 formed by the process wherein adding at least two columns to the compactor matrix includes adding at least two columns to the compactor matrix for every combination of the number of circuit outputs that produces unknown logic values at the same time plus one.

12. The compactor of claim 11 formed by the process including adding values to rows of said compactor matrix, such that for a first row the first column has a value one and the succeeding columns have the value zero and a second row has the column value zero followed by the column value one and a third row has the column value zero, zero followed by the column value one.

13. The compactor of claim 11 to handle any number of errors in the same scan cycle.

14. The compactor of claim 11 including the minimum number of scan outputs.

15. A response compactor comprising:
   a plurality of coupled exclusive OR gates to handle any number of scan chains with unknown logic values; and
   a control, coupled to said gates, to add two columns to a compactor matrix for each scan chain that produces an unknown value at an unknown logic value at the same time as another scan chain produces an unknown logic value.

* * * * *